(12) United States Patent
De Laat et al.

(10) Patent No.: US 8,029,973 B2
(45) Date of Patent: Oct. 4, 2011

(54) LITHOGRAPHIC METHOD AND CARRIER SUBSTRATE

(75) Inventors: Wilhelmus Johannes Maria De Laat, Heeswijk-Dinther (NL); Cheng-Qun Gui, Best (NL); Peter Theodorus Maria Giesen, Geldrop (NL); Paulus Wilhelmus Leonardus Van Dijk, Tilburg (NL); Erwin Rinaldo Meinders, Veldhoven (NL); Maria Peter, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 389 days.

(21) Appl. No.: 12/276,705

(22) Filed: Nov. 24, 2008

(65) Prior Publication Data

US 2009/0170025 A1 Jul. 2, 2009

Related U.S. Application Data

(60) Provisional application No. 60/996,925, filed on Dec. 11, 2007.

(51) Int. Cl.
*G03F 7/00* (2006.01)
*G03F 7/09* (2006.01)

(52) U.S. Cl. ............... 430/270.1; 430/271.1; 430/322
(58) Field of Classification Search ............. 430/270.1, 430/945; 355/53, 55, 72, 73
See application file for complete search history.

(56) References Cited

U.S. PATENT DOCUMENTS

| | | | | |
|---|---|---|---|---|
| 4,564,284 | A | * | 1/1986 | Tsutsui ............... 355/30 |
| 5,937,758 | A | * | 8/1999 | Maracas et al. ........... 101/327 |
| 6,842,229 | B2 | * | 1/2005 | Sreenivasan et al. ...... 355/75 |
| 6,900,881 | B2 | * | 5/2005 | Sreenivasan et al. ...... 355/72 |
| 7,001,696 | B2 | * | 2/2006 | Inao et al. ................ 430/5 |
| 7,077,992 | B2 | * | 7/2006 | Sreenivasan et al. ...... 264/496 |
| 7,140,861 | B2 | * | 11/2006 | Watts et al. ............ 425/174.4 |
| 7,329,464 | B2 | * | 2/2008 | Aoki ..................... 428/447 |
| 7,423,724 | B2 | * | 9/2008 | Hasegawa et al. ....... 355/53 |
| 7,864,427 | B2 | * | 1/2011 | Korenaga et al. ........ 359/576 |
| 2004/0025322 | A1 | * | 2/2004 | Binnard ................ 29/592.1 |

* cited by examiner

*Primary Examiner* — Amanda C. Walke
(74) *Attorney, Agent, or Firm* — Pillsbury Winthrop Shaw Pittman LLP

(57) ABSTRACT

A carrier substrate is provided with a layer of PDMS and curing agent on one side of the carrier substrate. The PDMS and curing agent can be arranged to receive and adhere to a lithographic substrate. The carrier substrate can be dimensioned such that the combined carrier substrate and lithographic substrate may be handled by a conventional lithographic apparatus.

16 Claims, 3 Drawing Sheets

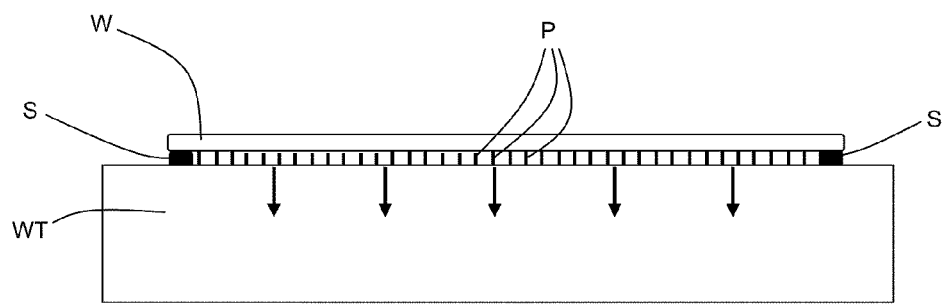
Figure 2
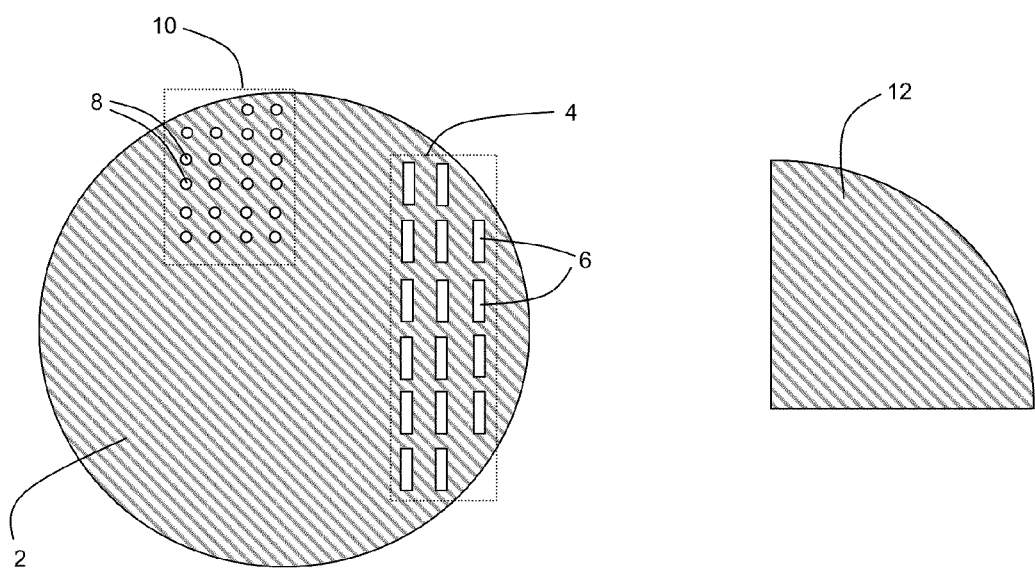
Figure 3a
Figure 3b

LITHOGRAPHIC METHOD AND CARRIER SUBSTRATE

This application claims priority and benefit under 35 U.S.C. §119(e) to U.S. Provisional Patent Application Ser. No. 60/996,925, filed on Dec. 11, 2007. The content of that application is incorporated herein in its entirety by reference.

BACKGROUND OF THE INVENTION

The present invention relates to a lithographic method and a carrier substrate.

A lithographic apparatus is a machine that applies a desired pattern onto a target portion of a substrate. A lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatuses include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In a conventional lithographic apparatus, a substrate onto which a pattern is to be projected is held on a substrate table by applying a vacuum through the substrate table onto a lowermost surface of the substrate. Once the pattern has been applied to the substrate, the vacuum is released to allow the substrate to be removed from the substrate table and replaced with a subsequent substrate to be patterned. In some instances, the shape or stricture of a substrate may be such that a vacuum cannot be used to hold the substrate on the substrate table.

It is desirable to provide a lithographic method and a lithographic carrier substrate which overcome or mitigate one or more problems of the prior art, whether identified herein or elsewhere.

SUMMARY

According to an aspect of the invention, there is provided a carrier substrate having a layer of PDMS and curing agent provided on one side, the PDMS and curing agent being arranged to receive and adhere to a lithographic substrate, the carrier substrate being dimensioned such that the combined carrier substrate and lithographic substrate may be handled by a conventional lithographic apparatus.

According to a second aspect of the invention, there is provided a lithographic method comprising adhering a lithographic substrate to a layer of PDMS and curing agent provided on a carrier substrate, then projecting a pattern onto the lithographic substrate using a lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a substrate table of the lithographic apparatus of FIG. 1 in more detail;

FIGS. 3a and 3b depict substrates with which an embodiment of the invention may be used;

DETAILED DESCRIPTION

Figure 1:
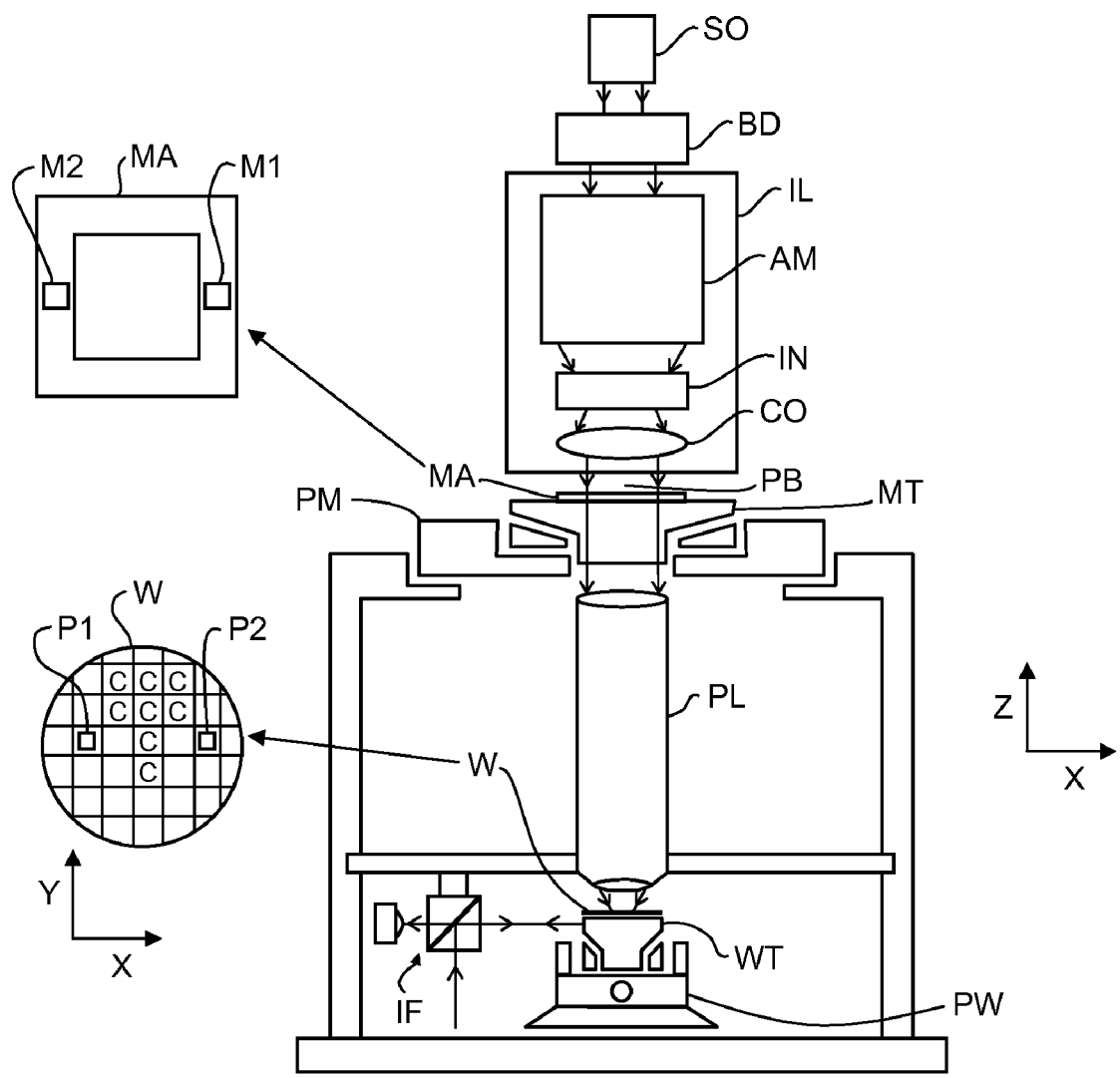
FIG. 1 depicts a lithographic apparatus in connection with which an embodiment of the invention may be used.

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual-stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus in connection with which an embodiment of the invention may be used. The apparatus comprises:
- an illumination system (illuminator) IL to condition a beam PB of radiation (e.g. UV radiation or DUV radiation).
- a support stricture MT to support a patterning device (e.g. a mask) MA and connected to first positioning device PM to accurately position the patterning device MA with respect to item PL;
- a substrate table (e.g. a wafer table) WT for holding a substrate (e.g. a resist-coated wafer) W and connected to second positioning device PW for accurately positioning the substrate W with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases, the source SO may be an integral part of the apparatus, for example when the source SO is a mercury lamp. The source SO and the illuminator IL, together with the beam delivery system BD if implemented, may be referred to as a radiation system.

The illuminator IL may include adjustable optical components AM for adjusting the angular intensity distribution of the beam PB. Generally, at least the outer and/or inner radial extent (commonly referred to as σ-outer and σ-inner, respectively) of the intensity distribution in a pupil plane of the illuminator IL can be adjusted. In addition, the illuminator IL generally comprises various other components, such as an integrator IN and a condenser CO. The illuminator IL provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In a conventional lithographic apparatus, the substrate W is retained on the substrate table WT by applying a vacuum from the substrate table WT onto a lowermost surface of the substrate W. Once patterning of the target portions C has been completed, the vacuum is released to allow the substrate W to be removed from substrate table WT. A further substrate to be patterned is then introduced onto the substrate table WT and the vacuum is reapplied. The vacuum holds the substrate W firmly in place on the substrate table WT such that it does not shift on the substrate table WT, even in the presence of fast acceleration or deceleration of the substrate table WT. This rigid clamping of the substrate W to the substrate table WT assists in ensuring that a pattern projected onto a given target portion C is aligned with patterns previously projected onto that target portion.

FIG. 2 schematically shows in cross-section a substrate table WT onto which a conventional substrate W is vacuum clamped. The substrate table WT is provided with a seal S. The seal S is annular in shape and has an outer diameter which is slightly less than the diameter of the substrate W. The substrate table WT is also provided with a plurality of protrusions P which extend upwards from the substrate table. The protrusions are dimensioned such that contamination particles inside the lithographic apparatus may settle between the protrusions P without contaminating the substrate W.

In use, the substrate W is positioned on the substrate table WT, and rests upon the protrusions P and the seal S. A vacuum is then applied by the substrate table WT. The vacuum is indicated in FIG. 2 by downwardly pointing arrows. The seal S prevents air from entering the area between the substrate W and the substrate table WT. The vacuum thus acts against the majority of the lowermost surface of the substrate W and draws it downwardly onto the protrusions P. The substrate W is thereby clamped in place, so that lithographic patterning of the substrate W may be performed.

The substrate table WT has dimensions which are intended to be used in connection with a substrate of conventional dimensions. Lithographic substrates are conventionally 300 mm or 200 mm in diameter. Thus, the outer diameter of the seal S is typically slightly less than 300 mm or slightly less than 200 mm.

FIGS. 3a and 3b show schematically types of substrates which it may not be possible to vacuum clamp to the substrate table WT. The substrate 2 shown in FIG. 3a includes a first region 4 (indicated by a dotted line) within which slots 6 are provided. The slots 6 are openings which pass through from an upper most surface to a lowermost surface of the substrate 2. Although only a region 4 of the substrate 2 is shown as being provided with slots 6, this is for illustrative purposes only, and conventionally the slots 6 will be provided across the entire substrate 2. The presence of the slots 6 in the substrate 2 prevents the substrate 2 from being vacuum clamped to the substrate table WT, since air is able to pass through the slots 6 into the area between the substrate 2 and the substrate table WT where the vacuum would be applied.

FIG. 3a also shows an area of the substrate 2 which has been provided with a plurality of holes 8. This area is surrounded by a dotted line 10. Although the holes 8 are shown only on part of the substrate 2, conventionally they will be provided across the entire substrate 2. The holes 8 prevent the substrate 2 from being vacuum clamped to the substrate table WT, since air is able to pass through the holes 8 and into an area between the substrate 2 and the substrate table WT where the vacuum would be applied.

FIG. 3b shows a substrate 12 having an unconventional shape. The substrate 12 approximately comprises a quarter of a conventional substrate. The substrate 12 is not sufficiently large to rest upon the seal S provided on the substrate table WT. Therefore, it is not possible to establish a vacuum in an area between the substrate 12 and the substrate table WT.

Shown in FIG. 4 is an embodiment of the invention which allows the substrates 2 and 12 shown in FIGS. 3a and 3b, respectively, to be vacuum-clamped to a substrate table WT.

Figure 4A:
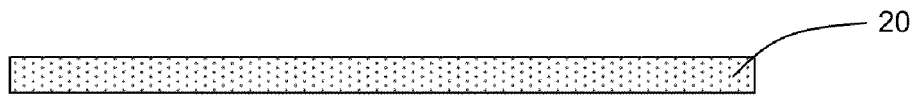
FIG. 4a-4c depict a method according to an embodiment of the invention.
Figure 4B:
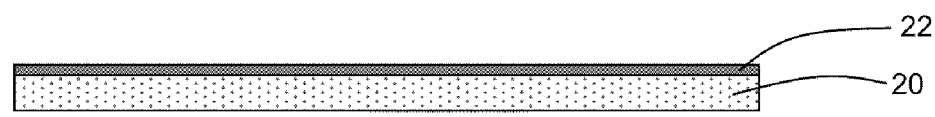
Figure 4C:
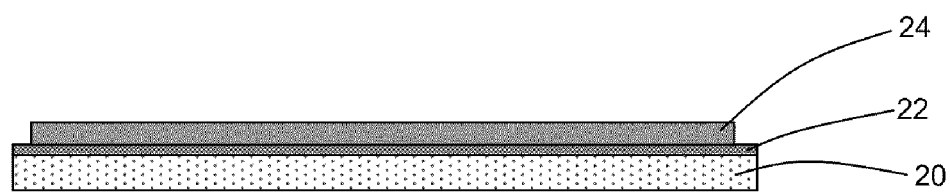

FIGS. 4a-4c illustrate bonding of a lithographic substrate to a carrier substrate according to an embodiment of the invention.

Referring to FIG. 4a, a carrier substrate 20 is provided. The carrier substrate is dimensioned such that when it is positioned on a substrate table, a vacuum may be established by the substrate table beneath the carrier substrate 20. Referring to FIG. 2, the carrier substrate 20 has a diameter which is sufficiently large that it lies over the seal S, thereby forming a volume within which a vacuum may be established. The carrier substrate 20 may be formed, for example, from silicon, glass, quartz or some other suitable material. The carrier substrate 20 may be, for example, a conventional lithographic substrate. The carrier substrate 20 may have, for example, a diameter of 200 mm or 300 mm (the diameter of the majority of conventional lithographic substrates). The carrier substrate 20 may have a different diameter, for example if the lithographic apparatus is configured to process lithographic substrates of that different diameter. In general, the diameter of the carrier substrate 20 corresponds with whichever diameter of lithographic substrate the lithographic apparatus is designed to handle.

Referring to FIG. 4b, a layer 22 of polydimethylsiloxane (PDMS) is provided over the carrier substrate 20. The PDMS includes a curing agent. An example of PDMS combined with a curing agent which may be used as the layer 22 is a commercially available product which is branded Sylgard® 184 and which is available from Dow Corning of Michigan, USA.

Referring to FIG. 4c, a lithographic substrate 24 is placed on top of the layer 22 of PDMS such that the substrate 24 adheres to the PDMS. The lithographic substrate 24 may include, for example, slots or holes. Additionally or alternatively, the lithographic substrate 24 may have a non-conventional shape or non-conventional dimensions.

The carrier substrate 20, layer 22 of PDMS and lithographic substrate 24 will be collectively referred to as the substrate and carrier combination 26.

The substrate and carrier combination 26 may be introduced into a lithographic apparatus, for example of the type shown schematically in FIG. 1. The substrate and carrier combination 26 may be vacuumed clamped to a substrate table WT of the lithographic apparatus in a conventional manner, thereby allowing projection of a pattern onto the substrate 24. The substrate and carrier combination 26 may be removed from the substrate table WT by releasing the vacuum, and replaced with a further substrate and carrier combination to be patterned. From the point of view of operation of the lithographic apparatus, the substrate and carrier combination 26 is handled in the same manner as a conventional substrate.

The total thickness of the substrate and carrier combination 26 may be less than 1.2 mm. This is the thickness of some conventional lithographic substrates. If the substrate 24 has this thickness, or a lesser thickness, then this may help to ensure that the substrate and carrier combination 26 may be handled in a conventional manner by the lithographic apparatus. Some lithographic apparatus are configured to handle thicker substrates, for example substrates having a thickness up to 2 mm. Where this is the case, the substrate and carrier combination 26 may have a thickness which corresponds with the thickness of the substrate which may be handled by that lithographic apparatus (for example 2 mm).

The lithographic substrate 24 may be adhered to the PDMS layer 22 by, for example, pressing the substrate 24 onto the PDMS. The pressure may be applied evenly across the surface of the substrate 24 to inhibit air inclusions occurring between the substrate 24 and the PDMS layer 22. This process may be performed in a clean room environment to reduce the risk of contamination being present.

The lithographic substrate 24 may be adhered to the PDMS layer 22 manually. Alternatively, the substrate 24 may be adhered to the PDMS layer 22 using an automated process. Where an automated process is used, the apparatus may comprise a contactless way of pressing on to the substrate 24. This may be achieved for example using pressure provided by a gas such as nitrogen, clean air, etc.

The PDMS layer 22 may be at room temperature when the lithographic substrate 24 is adhered to it. Alternatively, the PDMS layer 22 may be heated. This may be achieved for example by heating gas which is used to press the lithographic substrate 24 on to the PDMS layer 22.

The lithographic substrate 24 may be adhered to the PDMS layer 22 without applying pressure. This may be achieved for example by putting the lithographic substrate 24 in place and then heating up the PDMS layer 22 until the lithographic substrate 24 adheres to it.

The adhesion of the PDMS layer 22 is such that the lithographic substrate 24 is held on the carrier substrate 20 for sufficient time to allow a desired pattern to be projected on all desired target regions of the lithographic substrate 24. The adhesion may be such that the lithographic substrate 24 remains attached to the carrier substrate 20 for sufficient time to allow post-exposure processing of the lithographic substrate 24 to take place. This may comprise for example etching, sputtering, deposition, etc. The adhesion may be sufficient to allow pre-exposure processing of the lithographic substrate 24 to take place (for example spin-coating of resist onto the lithographic substrate 24).

The adhesion of the PDMS layer 22 may be such that the lithographic substrate 24 is adhered to the carrier substrate 20 for sufficient time to allow more than one patterned layer to be projected on to the lithographic substrate 24. It may be sufficient to allow all desired patterned layers to be projected on to the lithographic substrate 24, i.e. to form for example complete integrated circuits. This may for example be around seven layers in the case of a film transistor, or may be for example around thirty layers in the case of memory.

Processing of the lithographic substrate 24 should not heat the PDMS above around 200° C. as this may cause reduced adhesion of the lithographic substrate 24 to the PDMS layer 22, with the result that the lithographic substrate 24 may become detached from the carrier substrate 20.

A lithographic substrate 24 may be adhered to the carrier substrate 20 for some purpose other than lithographic projection of a pattern onto the substrate 24. For example, it may be done for processing steps such as etching, sputtering, deposition, etc.

The lithographic substrate 24 may be removed from the carrier substrate 20 when desired, using one of a variety of mechanisms. For example, a blade may be introduced between the lithographic substrate 24 and the PDMS layer 22, to form a gap between them and thereby sever the lithographic substrate 24 from the PDMS layer 22. Alternatively, a contactless vacuum system may be used to apply a vacuum to an upper surface of the lithographic substrate 24 in order to secure the lithographic substrate 24, and may then draw the lithographic substrate 24 away from the PDMS layer 22 and carrier substrate 20. The PDMS layer 22 may be at room temperature during either of these removal processes, or may be heated to a temperature which reduces its adhesion and thereby allows the lithographic substrate 24 to be more easily removed.

A dedicated apparatus may be used to remove the lithographic substrate 24 from the carrier substrate 20. This may for example comprise a substrate table arranged to receive and securely hold the carrier substrate 20. It may further comprise a moveable blade arranged to be inserted between the lithographic substrate 24 and the carrier substrate 20. Alternatively or additionally it may comprise a contactless vacuum system arranged to apply a vacuum to an upper surface of the lithographic substrate 24 and thereby draw the lithographic substrate 24 away from the carrier substrate 20.

It may be desired to remove the lithographic substrate 24 from the carrier substrate 20 in a clean room environment. However, contamination arising during removal is a lesser issue if all of the layers of a product being formed have already been provided on the lithographic substrate 24.

The adhesion provided by the layer 22 of PDMS is sufficiently high to allow exposure of the lithographic substrate 24 in the lithographic apparatus (and possibly also subsequent processing) without the lithographic substrate 24 becoming separated from the carrier substrate 20. The adhesion is sufficiently low that the lithographic substrate 24 may be separated from the carrier substrate 20 as desired once lithographic processing has been completed.

It may be possible to attach a new lithographic substrate to a PDMS layer 22 after a different lithographic substrate has been removed from the PDMS layer. It may be possible to do this multiple times.

In general, it may be said that lithographic substrates may be bondable to the carrier substrate 20 and removable from the carrier substrate 20.

In one approach, the lithographic substrate 24 may be attached to the carrier substrate 20 prior to resist being provided on the lithographic substrate 24. Alternatively, the attachment of the lithographic substrate 24 to the carrier substrate 20 may take place after resist has been provided on the lithographic substrate 24. This may occur for example in a substrate handling apparatus which is located adjacent to a lithographic apparatus or which forms part of a lithographic apparatus. For example, four carrier substrates 20 may be provided in a module which is arranged to adhere a lithographic substrate 24 to a carrier substrate 20 prior to it undergoing pre-alignment in a lithographic apparatus. The module may remove the lithographic substrate 24 from the carrier substrate 20 after the lithographic substrate 24 and carrier substrate 20 have been discharged from the lithographic apparatus. The carrier substrate 20 may then be reused. Typically, three lithographic substrates 24 are present in a lithographic apparatus at any given time, a first being pre-aligned, a second being exposed and a third being discharged. Thus, it may be possible to use four carrier substrates 20, the fourth carrier substrate receiving a lithographic substrate 24 whilst the three other carrier substrates 20 are inside the lithographic apparatus. Where this is done, a time delay may occur since it is usually better to remove a lithographic substrate 24 from the carrier substrate 20 before a new lithographic substrate 24 can be adhered to the carrier substrate 20. For this reason, five carrier substrates 20 may be used, and may thereby reduce or remove this time delay.

The PDMS layer 22 may be applied across the entire surface of the carrier substrate 20. Alternatively, an area at an edge of the carrier substrate 20 may be left uncoated. When this is done, this area may be of assistance when removing the lithographic substrate 24 from the carrier substrate 20. For example, a blade or other instrument may be inserted into this area.

If it is desired to remove the PDMS from the carrier substrate 20, then the PDMS may be peeled off by hand. Any remaining PDMS may be removed using plasma, peroxide and/or sulfuric acid.

Figure 5:
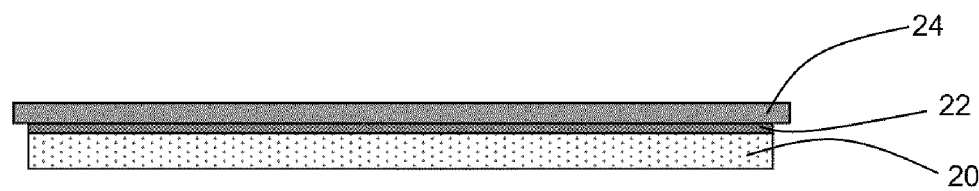
FIG. 5 depicts an additional method according to an embodiment of the invention.

FIG. 5 shows an embodiment of the invention which corresponds generally with the previously described embodiment of the invention, but which has some differences. Referring to FIG. 5, a carrier substrate 20 is provided with a layer 22 of PDMS upon which a lithographic substrate 24 is provided. The carrier substrate 20 has an outer diameter which is less than the outer diameter of the lithographic substrate 24. The outer diameter of the carrier substrate 20 is sufficiently large that it properly contacts the seal S provided on the substrate table (see FIG. 2) such that a vacuum may be generated between the substrate table and the carrier substrate 20.

The edge of the lithographic substrate 24 overhangs the carrier substrate 20. This overhang may for example be 1 mm or 2 mm or more. It may for example be less than 5 mm. The carrier substrate 20 may have a diameter which is less than 200 mm but is more than 195 mm (for example to be used in conjunction with a 200 mm diameter lithographic substrate). The carrier substrate 20 may have a diameter which is less than 300 mm but is more than 295 mm (for example to be used in conjunction with a 300 mm diameter lithographic substrate).

The overhang may be less than 5 mm in order to ensure that the lithographic substrate 24 is not allowed to bend. If bending were to occur, then this may compromise the accuracy with which a pattern is projected onto the lithographic substrate 24. To some extent whether or not bending will occur depends upon the thickness of the lithographic substrate 24. For this reason, a different overhang may be appropriate for different thicknesses of lithographic substrate 24.

In the embodiment shown in FIG. 5, during pre-alignment in a lithographic apparatus, an edge-detector which is arranged to determine the position of an edge of the substrate 24 may detect the edge of the lithographic substrate 24 rather than detecting the edge of the carrier substrate 20.

It is usually desired during pre-alignment to determine the position of the lithographic substrate 24 to within a predetermined accuracy, so that an alignment mark provided on the lithographic substrate 24 is located within a capture range of an alignment system in the lithographic apparatus. If the edge detector were to detect the edge of the carrier substrate 20 rather than the lithographic substrate 24, then the position of the lithographic substrate 24 will not have been measured by the edge detection. This means that in order for the alignment marks to fall within the capture range of the alignment system, the lithographic substrate 24 must be attached to the carrier substrate 20 with a high positional accuracy. The accuracy with which the lithographic substrate 24 must be attached to the carrier substrate 20 is reduced when the embodiment of the invention shown in FIG. 5 is used. When the embodiment of the invention shown in FIG. 5 is used, the accuracy requirement might be satisfied by merely ensuring that the overhang extends fully around the perimeter of the carrier substrate 20, and that the overhang is not so large at any location that it permits bending of the lithographic substrate 24 which may give rise to poor fidelity of the pattern projected onto the lithographic substrate 24.

While specific embodiments of the invention have been described above, it will be appreciated that the invention may be practiced otherwise than as described. The description is not intended to limit the invention.

What is claimed is:

1. A carrier substrate having a layer of PDMS and curing agent provided on one side, the PDMS and curing agent being arranged to receive and adhere to a photolithographic substrate, the carrier substrate being dimensioned such that a conventional photolithographic apparatus is able to handle a combination of the carrier substrate with the photolithographic substrate.

2. The carrier substrate of claim 1, wherein said carrier substrate is formed from silicon, glass or quartz.

3. The carrier substrate of claim 1, wherein a diameter of the carrier substrate is less than a diameter of the photolithographic substrate, but is sufficiently large to allow a seal to be formed between the carrier substrate and a substrate table of the conventional photolithographic apparatus.

4. The carrier substrate of claim 1, wherein the carrier substrate has a diameter which is less than a diameter of the photolithographic substrate, but is no more than 5 mm less than the diameter of the photolithographic substrate.

5. The carrier substrate of claim 1, wherein the carrier substrate has a diameter which is less than 200 mm but is more than 195 mm.

6. The carrier substrate of claim 1, wherein the carrier substrate has a diameter which is less than 300 mm but is more than 295 mm.

7. A lithographic method comprising:
adhering a photolithographic substrate to a layer of PDMS and curing agent provided on a carrier substrate, and
projecting a pattern onto the photolithographic substrate using a photolithographic apparatus.

8. The method of claim 7, wherein said adhering is performed by pressing the photolithographic substrate onto the PDMS and curing agent.

9. The method of claim 8, wherein said pressing is performed using a gas.

10. The method of claim 9, wherein the gas is heated.

11. The method of claim 7, wherein the photolithographic substrate remains attached to the carrier substrate by the PDMS layer during post-exposure processing.

12. The method of claim 11, wherein the photolithographic substrate remains attached to the carrier substrate by the PDMS layer during subsequent projection of a different pattern onto the photolithographic substrate using a photolithographic apparatus.

13. The method of claim 7, further comprising:
removing the photolithographic substrate from the PDMS layer on the carrier substrate after the pattern has been projected onto the photolithographic substrate and before post-exposure processing.

14. The method of claim 13, further comprising:
adhering a different photolithographic substrate to the PDMS layer on the carrier substrate.

15. The method of claim 7, further comprising:
removing the photolithographic substrate from the PDMS layer on the carrier substrate, using a vacuum.

16. The method of claim 7, wherein, during the projecting, the carrier is held on a chuck of the photolithographic apparatus.

* * * * *